United States Patent
Xue et al.

(10) Patent No.: US 8,481,368 B2
(45) Date of Patent: Jul. 9, 2013

(54) SEMICONDUCTOR PACKAGE OF A FLIPPED MOSFET AND ITS MANUFACTURING METHOD

(75) Inventors: Yan Xun Xue, Los Gatos, CA (US); Yueh-Se Ho, Sunnyvale, CA (US); Hamza Yilmaz, Saratoga, CA (US); Jun Lu, San Jose, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 182 days.

(21) Appl. No.: 13/092,059

(22) Filed: Apr. 21, 2011

(65) Prior Publication Data
US 2011/0193208 A1    Aug. 11, 2011

Related U.S. Application Data

(63) Continuation-in-part of application No. 11/894,240, filed on Mar. 31, 2008.

(51) Int. Cl.
*H01L 21/44* (2006.01)

(52) U.S. Cl.
USPC ........... 438/113; 438/108; 438/121; 438/122; 438/123; 438/124

(58) Field of Classification Search
USPC .................. 438/113, 108, 121, 122, 123, 124
See application file for complete search history.

(56) References Cited

U.S. PATENT DOCUMENTS

2007/0241432 A1* 10/2007 Shim et al. ............... 257/675
2009/0166826 A1* 7/2009 Janducayan et al. ...... 257/676

* cited by examiner

*Primary Examiner* — Long Pham
(74) *Attorney, Agent, or Firm* — Chein-Hwa Tsao; CH Emily LLC

(57) ABSTRACT

The invention relates to a semiconductor package of a flip chip and a method for making the semiconductor package. The semiconductor chip comprises a metal-oxide-semiconductor field effect transistor. On a die paddle including a first base, a second base and a third base, half-etching or punching is performed on the top surfaces of the first base and the second base to obtain plurality of grooves that divide the top surface of the first base into a plurality of areas comprising multiple first connecting areas, and divide the top surface of the second base into a plurality of areas comprising at least a second connecting area. The semiconductor chip is connected to the die paddle at the first connecting areas and the second connecting area.

5 Claims, 6 Drawing Sheets

US 8,481,368 B2

SEMICONDUCTOR PACKAGE OF A FLIPPED MOSFET AND ITS MANUFACTURING METHOD

PRIORITY CLAIM

This application is a continuation-in-part (CIP) and claims the priority benefit of a U.S. patent application Ser. No. 11/894,240 filed Mar. 31, 2008, the entire disclosures of which are incorporated herein by reference.

TECHNICAL FIELD

The invention generally relates to a semiconductor package of a power semiconductor device and its manufacturing method, and more particularly to a semiconductor package comprising a flipped metal-oxide-semiconductor field effect transistor (MOSFET).

BACKGROUND TECHNOLOGY

With the development of conventional manufacturing technologies of integrated circuits and trend of reduction of semiconductor chip's size, apparatus heat conduction engineering is playing an important role in improving the performance of semiconductor apparatuses, in particular for some special chip types, such as MOSFET.

Usually, in a preparation process of packaging the semiconductor power device, the semiconductor chips are designed with various heat conduction modes. As the size of the device is gradually reduced, the performance of the device is improved by many different heat dissipation techniques. US patent publication number 20070108564 discloses a semiconductor package system manufactured by flip chip technologies. FIG. 1 is a semiconductor package system 100 including a power semiconductor chip 102. The semiconductor package system 100 includes a metal frame 110 disposed on top of the flipped power semiconductor chip 102 electrically connecting to source pin 106 and gate pin 108 through interconnecting structures 104. The soft conductor 114 is deposited on the backside metallization layer 120 to provide for electrical and/or heat transfer from the power semiconductor chip 102 to the metal frame 110. In the semiconductor package system 100, the arrangement of metal frame 110, pin 106, pin 108 and power chip 102 cannot achieve optimal heat dissipation effect as power semiconductor chip 102 is not directly contacted with pin 106 and pin 108 but electrically connected with pin 106 and pin 108 through the interconnecting structure 104 of solder balls or bumps.

Actually, for the semiconductor chip such as the double-diffuse-metal-oxide-semiconductor field effect transistor (DMOSFET), there are a gate electrode and a source electrode are disposed at the top surface of the device. If the solder balls or bumps are used to connect the gate electrode and the source electrode to the pins, the heat performance of the device can be affected more obviously. In view of the situation, the invention discloses a chip packaging process based on flip chip technology.

SUMMARY OF THE INVENTION

The invention provides a semiconductor device including a semiconductor chip flipped and mounted on a die paddle. The die paddle includes a first base, a second base and a lead base. A plurality of grooves are formed on the top surface of the first base and the second base to divide the top surface of the first base into a plurality of first connecting areas and to form a second connecting area on the second base.

The semiconductor chip is flipped and attached on the first base and the second base with the first electrode of the chip is connected to the first connecting areas and the second electrode of the chip is connected to the second connecting area.

A first groove at the edge of the top surface of the first base and a corresponding first groove at the edge of the top surface of the second base are formed on a first straight line. A second groove, which is perpendicular to the first groove, at the edge of the top surface of the first base and a corresponding second groove at the edge of the top surface of the second base are also formed on a second straight line. The first and second straight lines together with other grooves on the edge of the top surface of the first base form a rectangle surrounding groove surrounding the semiconductor chip when it is mounted on the die paddle.

The semiconductor chip can be a metal-oxide-semiconductor field effect transistor (MOSFET), in which the first electrode is the source electrode, the second electrode is the gate electrode, and the third electrode at the back surface of the chip is the drain electrode. The third electrode of the chip is electrically connected to the lead base through a bonding wire. The scribe line surrounding the edge of the chip is arranged just above the rectangle surrounding groove.

The invention further provides a manufacturing method for packaging the semiconductor device as described above. The method starts with a lead frame comprising a plurality of die paddle, each of which consists of a first base, a second base and a lead base. The top surface of the first base comprises a plurality of first connecting areas and the top surface of the second base at least comprises a second connecting area.

Conductive material is coated on the first connecting areas and the second connecting areas. A semiconductor chip is flipped and attached on the first base and the second base with the first electrode of the chip contacted with the first connecting areas and the second electrode of the chip contacted with the second connecting area. The third electrode at the back surface of the chip is electrically connected to the lead base with a bonding wire.

The lead frame, the chip and the bonding wire are sealed by molding material, then the lead frame and the molding material are cut to separate individual packages, each of which includes the chip, the bonding wire and the die paddle housing with the molding material.

A plurality of grooves are formed on the top surface of the first base and the second base, which divide the top surface of the first base into a plurality of first connecting areas and form a second connecting area on the top surface of the second base. The grooves are formed by half-etching or punching on the top surfaces of the first base and the second base.

A first groove at the edge of the top surface of the first base and a corresponding first groove at the edge of the top surface of the second base are formed on a first straight line, and a second groove, which is perpendicular to the first groove, at the edge of the top surface of the first base and a corresponding second groove at the edge of the top surface of the second base are formed on a second straight line. The first and second straight lines together with other grooves on the edge of the top surface of the first base form a rectangle surrounding groove. When the chip is connected on the first base and the second base, the scribe line surrounding the edge of the chip is arranged just above the rectangle surrounding groove.

The advantages of the invention are obvious when technical personnel of the field read the detail specifications of the preferable embodiments below and refer to drawings.

BRIEF DESCRIPTION OF DRAWINGS

The drawings describe the embodiment of the invention more sufficiently. However, the drawings are only used for specification and description, and cannot restrict the scope of the invention.

DETAILED DESCRIPTION OF THE INVENTION

Figure 1:
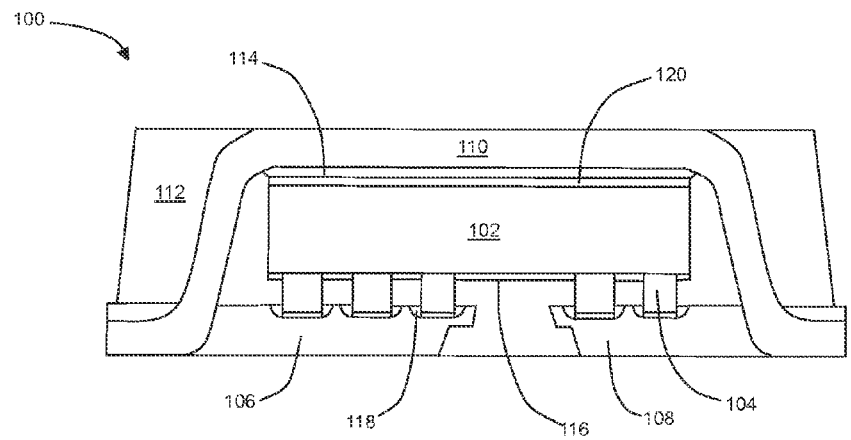
FIG. 1 is a cross-sectional schematic diagram of a conventional semiconductor package system manufactured by flip chip technology.
Figure 2A:
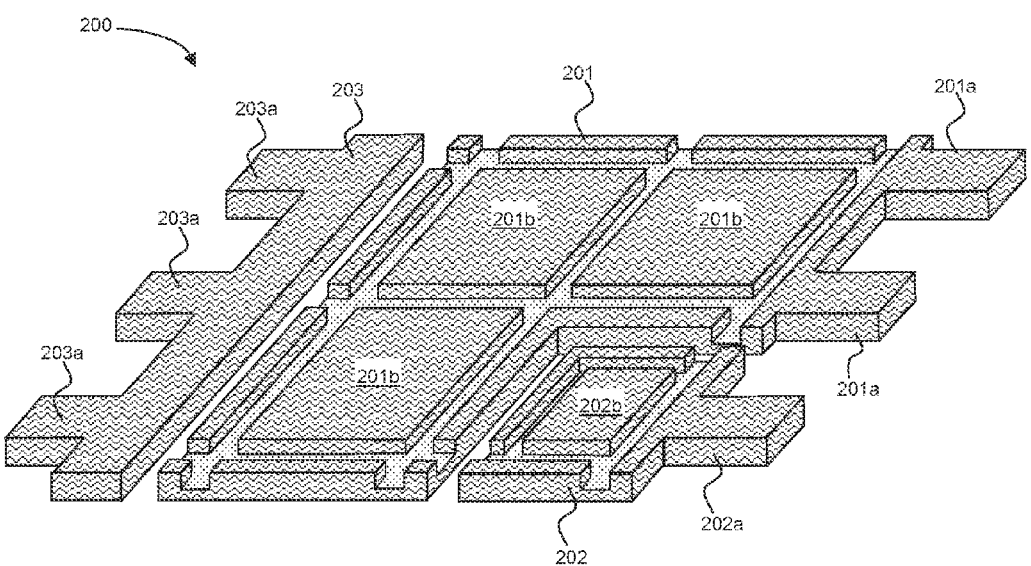
FIG. 2A is a three-dimensional schematic diagram of a semiconductor package of the present invention.
Figure 2B:
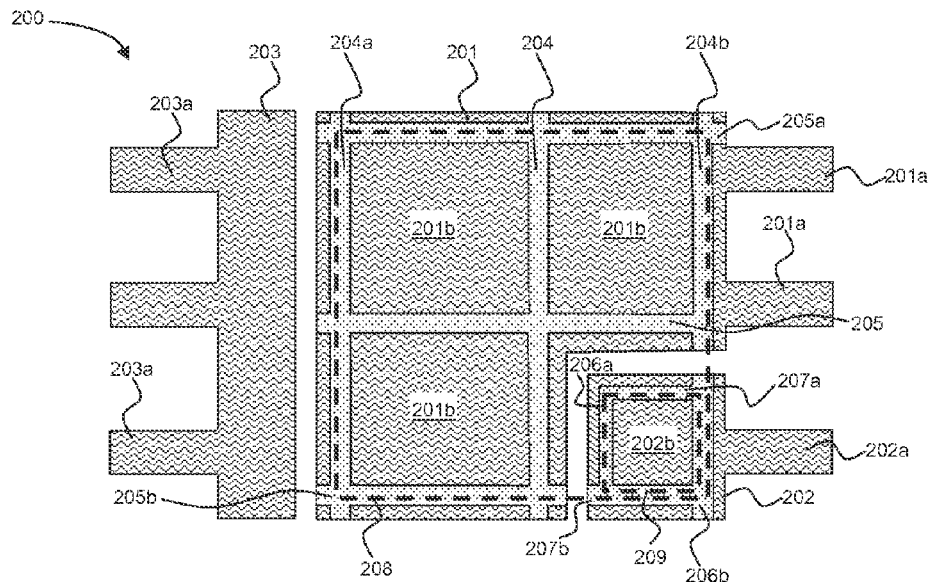
FIG. 2B is a top view schematic diagram of semiconductor package of FIG. 2A.

As shown in FIG. 2A, a die paddle 200 includes a first base 201, a second base 202 and a lead base 203. The die paddle is packaged together with a semiconductor chip 300 of the type described in FIG. 3 to form a semiconductor package 400 as shown in FIG. 4. The second base 202 and the lead base 203 are arranged near the first base 201 and are separated from the first base 201. FIG. 2B is a top view of the FIG. 2A. As shown in FIG. 2B, a plurality of grooves 204, 204a, 204b, 205, 205a and 205b are formed on the top surface of the first base 201 and a plurality of grooves 206a, 206, 207a and 207b are formed on the top surface of the second base 202. The grooves described in FIG. 2B are only used for convenient description and explanation and the number of the grooves is not limited. The grooves 204, 204a, 204b, 205, 205a and 205b at the top surface of the first base 201 divide the top surface of the first base 201 into multiple areas comprising a plurality of first connecting areas 202b. The grooves 206a, 206b, 207a and 207b at the top surface of the second base 202 form a second connecting area 202b.

Figure 2C:
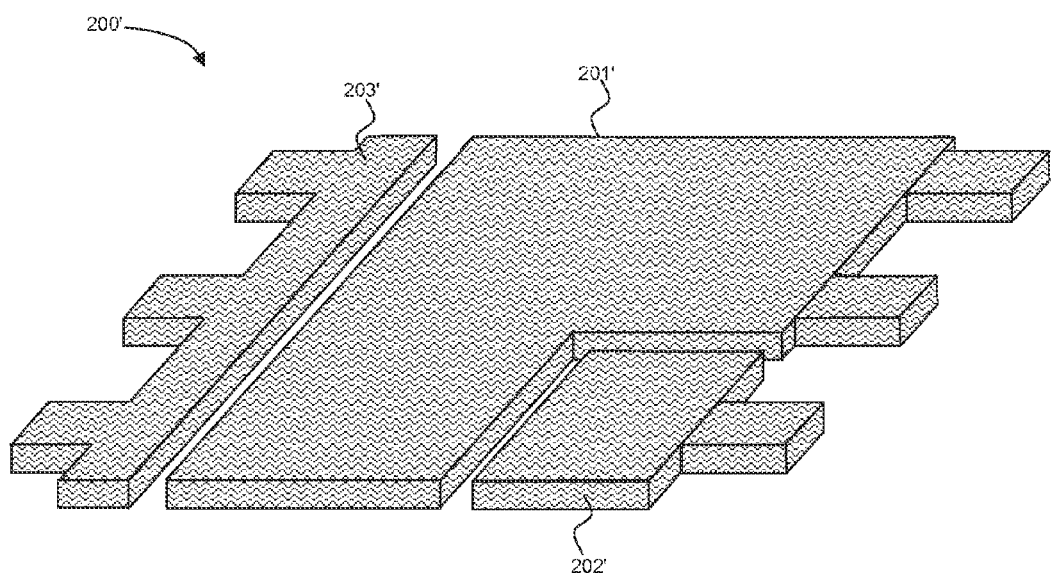
FIG. 2C is a three-dimensional schematic diagram of the lead frame before etching.

Refer to FIGS. 2A and 2B, the first base 201 is also connected to pins 201a, the second base 202 is also connected to pins 202a, and the lead base 203 is also connected to pins 203a. FIG. 2C is a three-dimensional schematic diagram of a die paddle 200' that is similar to the die paddle 200 of FIG. 2A without the grooves. The grooves as shown in FIGS. 2A and 2B can be formed on the die paddle 200' by different methods. One preferable method is to perform etching or punching from the top surfaces of the first base 201' and the second base 202' to a depth that equals to a half thickness of the die paddle.

Figure 3:
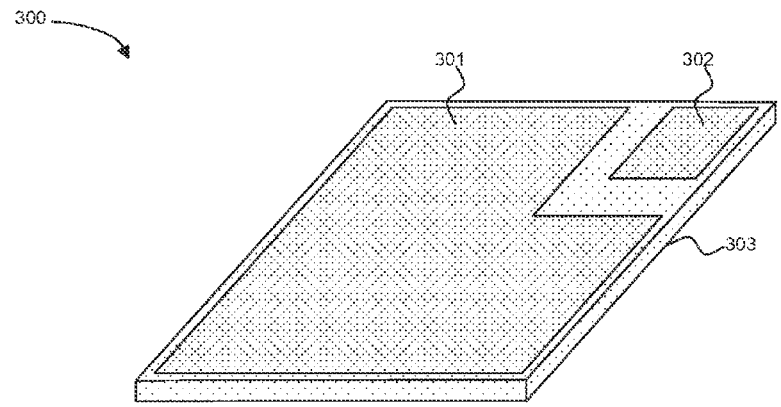
FIG. 3 is a three-dimensional schematic diagram of a semiconductor chip.
Figure 4:
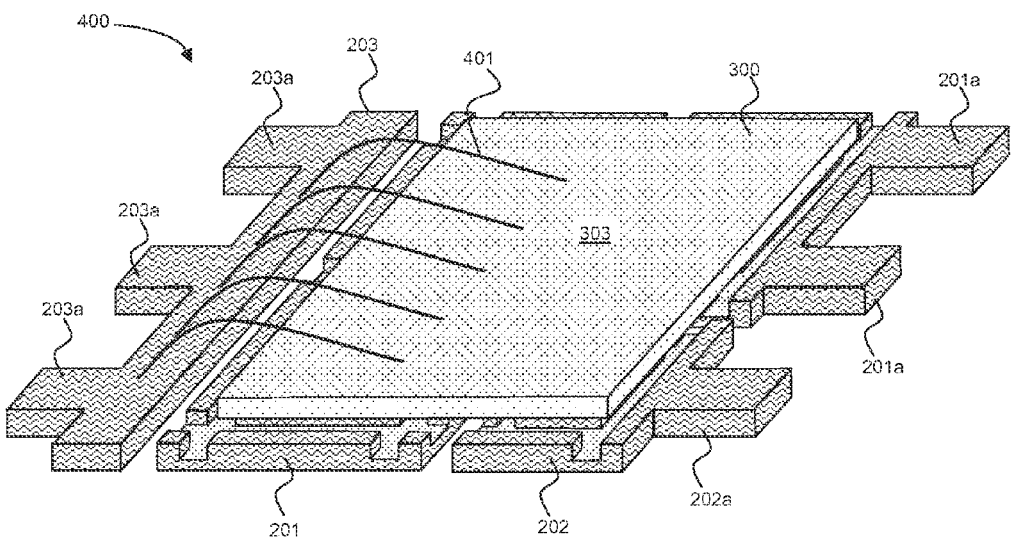
FIG. 4 is a three-dimensional schematic diagram illustrating the semiconductor chip connected on the lead frame.

As shown in FIG. 3, the semiconductor chip 300 can be a vertical type power device, such as a top-source bottom-drain metal-oxide-semiconductor field effect transistor, then the first electrode 301 of the semiconductor chip 300 is a source electrode, the second electrode 302 is a gate electrode and the third electrode 303 is a drain electrode that is arranged at the back surface (not shown) of semiconductor chip 300. As shown in FIG. 4, the semiconductor chip 300 is flipped and attached on the die paddle 200. In FIG. 4, the first electrode 301 of the semiconductor chip 300 is connected to the first connecting areas 201b, the second electrode 302 of the semiconductor chip 300 is connected to the second connecting area 202b, and the third electrode 303 at the back surface of the semiconductor chip 300 is electrically connected with lead base 203 through bonding wire 401. The bonding wire 401 can also be replaced by other conductors such as metal belts, metal plates, and the likes. Alternatively, the semiconductor chip 300 can be a top-drain bottom-source vertical metal-oxide-semiconductor field effect transistor, as such the first electrode 301 is the drain electrode, the second electrode 302 is the gate electrode and the third electrode 303 at the back surface of the chip 300 is the source electrode.

Figure 5:
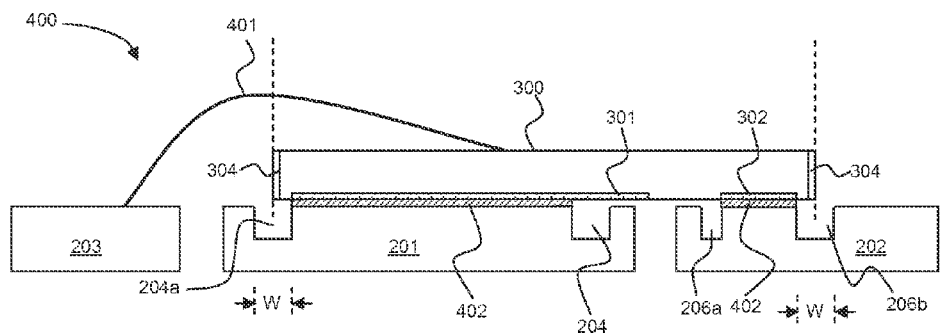
FIG. 5 is a cross-sectional schematic diagram of the semiconductor chip connected on the lead frame of FIG. 4.

FIG. 5 is a cross-sectional schematic diagram of the structure shown in FIG. 4. Referring to FIGS. 2A and 2B, a groove 205b at the edge of the top surface of the first base 201 and a corresponding groove 207b at the edge of the top surface of the second base 202 are arranged on the same straight line, and a groove 204b at the edge of the top surface of the first base 201 and a corresponding groove 206b at the edge of the top surface of the second base 202 are arranged on the same straight line. The grooves 205b, 207b, 204b and 206b together with other grooves 204a and 205a on the edge of the top surface of the first source lead 201 form a rectangle surrounding groove 208, marked by broken line, which surrounds the first connecting areas 201b. Furthermore, grooves 206a, 206b, 207b and 207a at the edge of the top surface of the second base 202 form another rectangle surrounding groove 209 marked by broken line, which surrounds the second connecting area 202b.

As shown in FIGS. 4 and 5, when connect the semiconductor chip 300 onto the die paddle 200, the scribe line 304 around the edge of the semiconductor chip 300 must be arranged just above the surrounding groove 208 to prevent the semiconductor chip 300 from electrical short with other components of the die paddle 200. The scribe line 304 is a space on a wafer between semiconductor chips, and after the semiconductor chips are separated by cutting or breaking, the scribe line 304 is partially retained in the surrounding of the edge of the semiconductor chip 300. The size of the rectangle of the surrounding groove 208 is adjusted based on the size of semiconductor chip 300 with the size of the rectangle slightly larger than that of the semiconductor chip 300. Referring to FIGS. 2B and 5, if the width of the grooves 204a, 205a, 204b, 206b, 207b and 205b is W, then the scribe line 304 around the edge of the semiconductor chip 300 is positioned within the width of the grooves in vertical direction.

Figure 6:
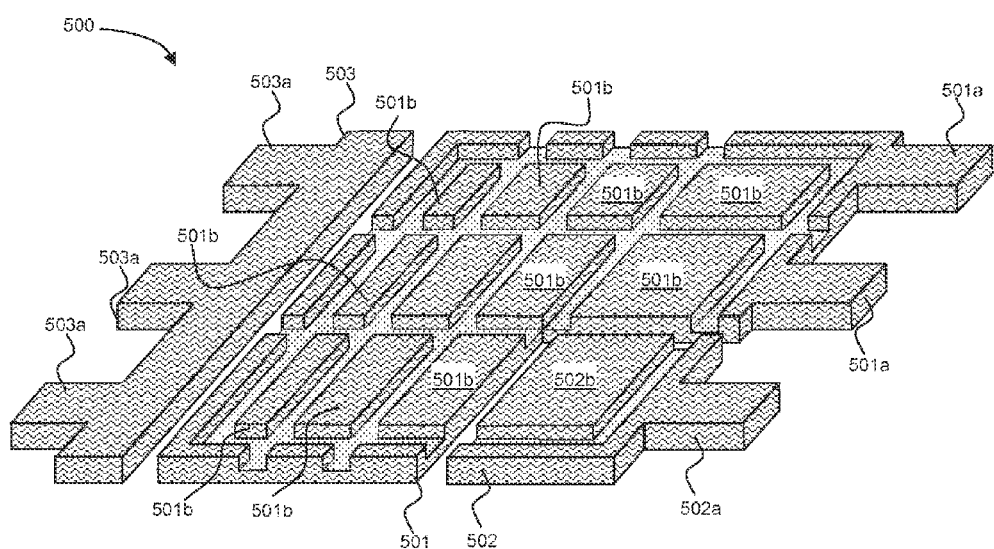
FIG. 6 is a three-dimensional schematic diagram illustrating the lead frame after etching.

The die paddle 200 as shown in FIG. 2B can also be replaced by the die paddle 500 as shown in FIG. 6. The structures of the die paddle 200 and the die paddle 500 is similar excepting that the top surface of the source base 501 in the die paddle 500 is divided into multiple smaller first connecting areas separated by a plurality of the grooves. However, the second base 502 only includes the grooves at the sides that are not adjacent to the first base 501, resulting at the top surface of the second base 502 a second connecting area 502b. The grooves can be formed by the process of half etching or punching on the surfaces of the first base 501 and the second base 502 with different etching patterns or punching patterns.

Figure 7A:
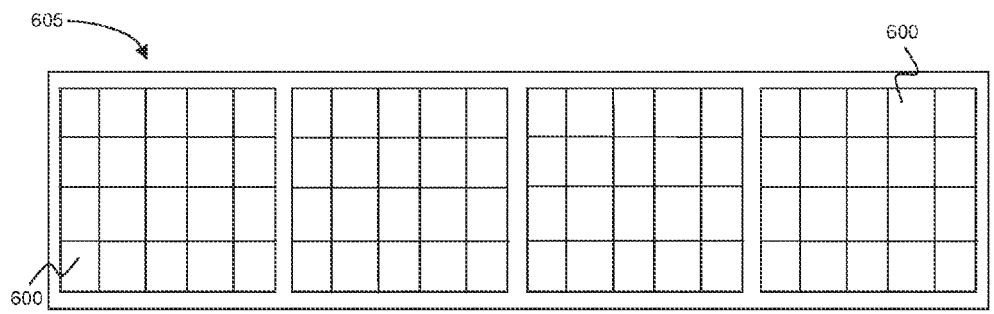
FIGS. 7A-7G are cross-sectional view illustrating a preparation flow diagram of the semiconductor package of the present invention.

A process for making the semiconductor device 400 shown in FIG. 4 is shown in FIGS. 7A-7E. FIG. 7A is a top view schematic diagram of a lead frame 605 that includes a plurality of die paddles 600 of the type depicting in FIGS. 2A and 6, each of which consists of a first base 601, a second base 602 and a lead base 603. The top surface of the first base 601 comprises a plurality of first connecting areas and the top surface of the second base 602 comprises a second connecting area.

Figure 7B:
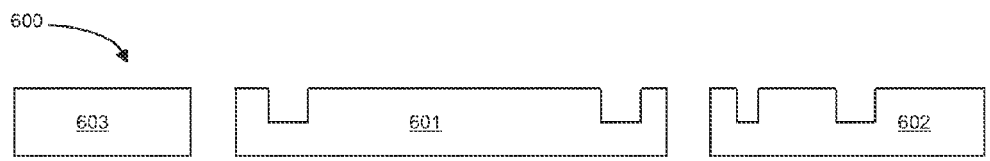
Figure 7C:
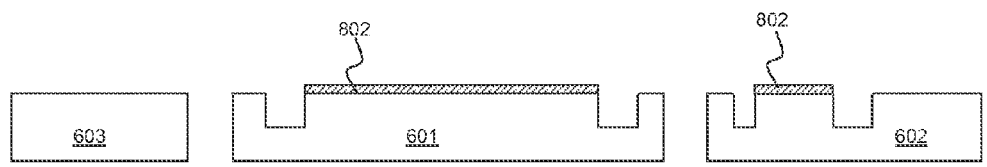
Figure 7D:
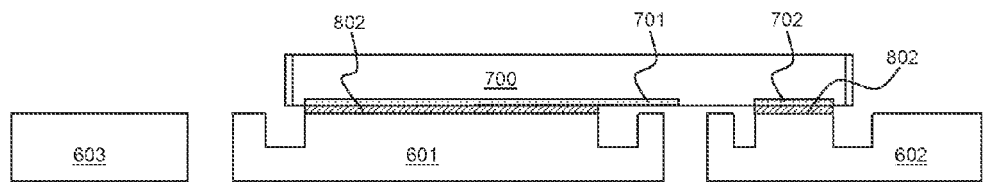
Figure 7E:
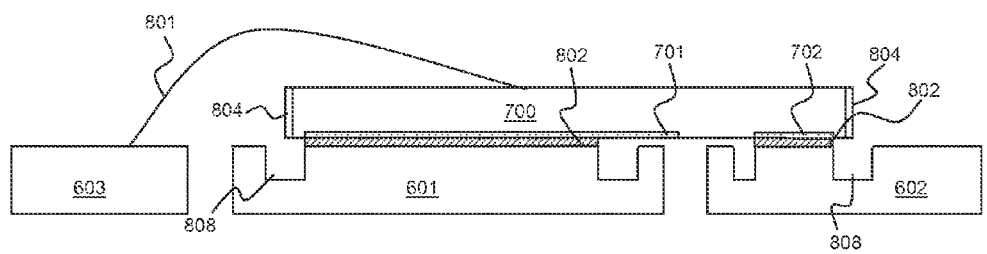

FIG. 7B is a cross-sectional schematic diagram illustrating a die paddle 600. In FIGS. 7B-7D, a semiconductor chip 700 of the type of the semiconductor chip 300 shown in FIG. 3 is flipped and attached on the first base 601 and the second base 602 by a conductive material 802 deposited on the first connecting areas and the second connecting area. The first electrode 701 of the chip 700 is connected to the first connecting areas, and the second electrode 702 of the chip 700 is connected to the second connecting area. The conductive material 802 can be a solder (like soldering paste), a conductive binder (like conductive silver paste), or an eutectic compound. The first electrode 701 and the second electrode 702 of the chip 700 can be coated with pure stannum (Sn) or aurum-stannum (Au—Sn) alloys. The first electrode 701 and the second electrode 702 can be connected on the first connecting areas and the second connecting area coated with aurum or silver using eutectic technique. When the die paddle 600 is heated to a proper eutectic temperature, the eutectic layer is solidified and the chip 700 is firmly connected on the first base 601 and the second base 602. The grooves 808 surrounded the semiconductor chips and the first and second connecting areas prevent the conductive material 802 spreading out from the die paddle 600, and the plurality of first and second connecting areas enhance the connection strength between the semiconductor chip 700 and the first and second bases 601 and 602. As shown in FIG. 7E, the third electrode at the back surface of the semiconductor chip 700 is electrically connected with the lead base 603 by bonding wire 801.

Figure 7F:
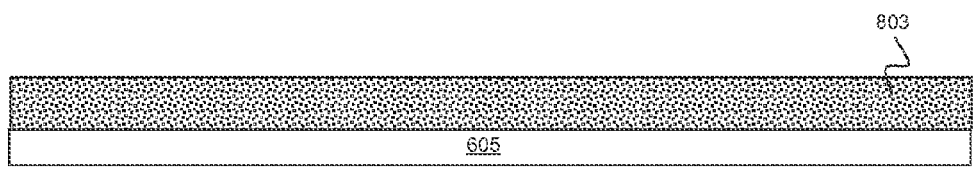
Figure 7G:
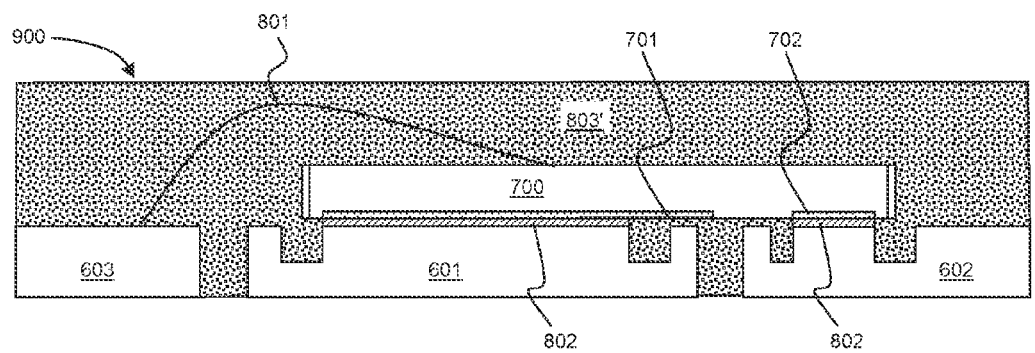

A molding material 803 is used for housing the lead frame 605, the chip 700 and the bonding wire 801 forming a complete package. FIG. 7F is a cross-sectional schematic diagram showing the molding material 803 deposited on top of the lead frame 605 with the semiconductor chip 700 and bonding wires formed on its surface. Then, the lead frame 605 and the molding material 803 are cut to separate individual semiconductor packages 900, each of which includes the semiconductor chip 700, the bonding wire 801 and the die paddle 600 covered by the molding material 803' as shown in FIG. 7G. The die paddle 600 includes a plurality of pins (not shown), which are similar to the pins 201a, 202a and 203a of the die paddle 200 as shown in FIGS. 2A and 2B, which can be used as connecting bars for connecting the die paddle 600 and the lead frame 605 The pins of each die paddle are also separated during the process of cutting the lead frame 605 and the molding material 803. When the chip 700 is flipped and attached on the first base 601 and the second base 602 as shown in FIG. 7D, the scribe line 804 around the edge of the chip 700 must be arranged just above the surrounding groove 808 of the die paddle 600. In one preferable embodiment of the invention, the semiconductor chip 700 is a top source and bottom drain metal-oxide-semiconductor field effect transistor, in which the first electrode 701 is the source electrode, the second electrode 702 is the gate electrode and the third electrode is the drain electrode. In an alternative embodiment of the invention, the semiconductor chip 700 is a top drain and bottom source metal-oxide-semiconductor field effect transistor, in which the first electrode 701 is the drain electrode, the second electrode 702 is the gate electrode and the third electrode is the source electrode.

Typical embodiments of specific structures of a detailed enforcement mode are given out through specifications and drawings. For example, the scheme is described as the metal-oxide semiconductor field effect transistor. Based on the spirit of the invention, the chip can also be used as conversion of other types. Although the invention discloses the current preferable embodiments, the contents are not limited.

Various changes and corrections are undoubtedly obvious for the technical personnel of the field after reading the specification. Therefore, the attached claims shall be considered to be all the changes and corrections covering the true intention and scope of the invention. Any and all equivalent scopes and contents within the claims shall be considered to be still within the intention and scope of the invention.

The invention claimed is:

1. A method for flip-chip packaging a semiconductor device comprising:
   providing a lead frame comprising a plurality of die paddles, each of which includes a first base, a second base and a lead base, wherein the second base and the lead base are arranged near the first base and separated from the first base, and wherein a plurality of grooves are formed on a top surface of the first base and a top surface of the second base with the grooves arranged on the top surface of the first base dividing the top surface of the first base into multiple areas comprising a plurality of first connecting areas, and the grooves arranged on the top surface of the second base divide the top surface of the second base into multiple areas comprising at least a second connecting area;
   coating a conductive material on the first connecting areas and the second connecting area;
   flipping and connecting a semiconductor chip on the first base and the second base, wherein a first electrode of the semiconductor chip is contacted with the first connecting areas and the second electrode of the semiconductor chip is contacted with the second connecting area;
   connecting a third electrode located at a back surface of the semiconductor chip to the lead base by a bonding wire;
   encapsulating the lead frame, the semiconductor chip and the bonding wire by molding material; and
   cutting the lead frame and the molding material to separate individual packages, each of which includes the semiconductor chip, the bonding wire and the die paddle encapsulated with the molding material.

2. The method of claim 1, wherein the grooves are formed by half-etching or punching on the top surfaces of the first base and the second base.

3. The method of claim 1, wherein first grooves formed on an edge of the top surface of the first base and first grooves formed on an edge of the top surface of the second base are arranged on a first straight line, and second grooves formed on an edge of the top surface of the first base and second grooves formed on an edge of the top surface of the second base are arranged on a second straight line, wherein the first and second straight lines along with other groves formed on edges of the top surface of the first base form a rectangle surrounding groove.

4. The method of claim 3 wherein flipping and connecting a semiconductor chip on the first base and the second base comprising positioning scribe lines of the semiconductor chip just above the surrounding groove.

5. The method of claim 1 wherein the semiconductor chip is a metal-oxide semiconductor field effect transistor, wherein the first electrode is a source electrode of the semiconductor chip, the second electrode is a gate electrode of the semiconductor chip, and the third electrode at the back surface of the semiconductor chip is a drain electrode of the semiconductor chip.

* * * * *